United States Patent
Matsudo et al.

(10) Patent No.: US 7,167,061 B2
(45) Date of Patent: Jan. 23, 2007

(54) TUNING FORK SHAPED CRYSTAL OSCILLATOR AND METHOD OF FABRICATION THEREOF

(75) Inventors: Hideryo Matsudo, Saitama (JP); Jun Katase, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/946,889

(22) Filed: Sep. 22, 2004

(65) Prior Publication Data
US 2005/0088250 A1    Apr. 28, 2005

(30) Foreign Application Priority Data
Sep. 25, 2003    (JP) .............................. 2003-333033

(51) Int. Cl.
*H03B 5/30*    (2006.01)
(52) U.S. Cl. .................. 331/156; 73/504.16; 310/329; 310/370
(58) Field of Classification Search ............. 73/504.16; 310/370, 329; 331/154, 156
See application file for complete search history.

(56) References Cited

U.S. PATENT DOCUMENTS 6,474,162 B1 * 11/2002 Voss et al. ................ 73/504.16
6,532,817 B1 * 3/2003 Yukawa et al. .......... 73/504.16

FOREIGN PATENT DOCUMENTS

| EP | 0 955 519 A2 | 11/1999 |
|---|---|---|
| JP | 2002-188922 | 7/2002 |

OTHER PUBLICATIONS

European Search Report dated Jul. 5, 2005.

* cited by examiner

*Primary Examiner*—Arnold Kinkead
(74) *Attorney, Agent, or Firm*—Scott D. Wofsy; Edwards Angell Palmer & Dodge LLP

(57) ABSTRACT

The present invention provides a tuning fork shaped oscillator, an angular velocity sensor element, and an angular velocity sensor with improved breaking strength with respect to CI and drive power, CI stability, and frequency stability. The present invention relates to a tuning fork shaped crystal oscillator of a configuration wherein two tuning fork shaped crystal elements that have been formed by wet etching during the process of forming the external shape of a tuning fork, in such a manner that the longitudinal direction of the tuning fork is aligned on the Y-axis of the crystalline axes (XYZ) and also the lateral direction thereof is aligned on the X-axis, are bonded together with the ±X-axis directions thereof oriented in opposite directions; and the right side surface of each of the two tuning fork shaped crystal elements is the +X face of the crystal when the two tuning fork shaped crystal elements are viewed in an upright attitude.

15 Claims, 10 Drawing Sheets

TUNING FORK SHAPED CRYSTAL OSCILLATOR AND METHOD OF FABRICATION THEREOF

BACKGROUND OF THE INVENTION

The present invention relates to a crystal oscillator in the shape of a tuning fork, an angular velocity sensor element, an angular velocity sensor, and a method of fabricating a tuning fork shaped crystal oscillator, and, in particular, to an angular velocity sensor element and a method of fabrication thereof.

Angular-velocity sensor elements are used in applications such as vehicle guidance systems and devices for preventing camera shake. The present applicants have already applied for a Japanese patent for an angular velocity sensor element obtained by using direct bonding to attach two tuning fork shaped crystal elements.

A perspective view of a prior-art example of an angular velocity sensor element is shown in FIG. 7.

This angular velocity sensor element is provided with a composite tuning fork shaped crystal element 1 obtained by attaching two tuning fork shaped crystal elements 1a and 1b by direct bonding, as shown in FIG. 7. The width of each of the tuning fork shaped crystal elements 1a and 1b is arranged on the X-axis of the crystalline axes (XYZ) of the crystal, with the length thereof on the Y-axis and the thickness thereof on the Z-axis. When one of these tuning fork shaped crystal elements 1a and 1b is viewed in an upright attitude, the negative direction along the X-axis is to the right-hand side and the positive direction thereof is to the left-hand side. In other words, the −X face of the crystal that is orthogonal to the −X-axis direction is taken to be the right-side surface of the tuning fork shaped crystal. The tuning fork shaped crystal elements 1a and 1b are bonded together with the ±X-axis directions thereof oriented in opposite directions.

When the composite tuning fork shaped crystal element 1 is fabricated, two Z-cut crystal wafers 2a and 2b are first bonded together directly, with the ±X-axis directions thereof oriented in opposite directions. Etching masks 3 as shown in FIG. 8 in the shape of a tuning fork are then formed on the front and rear of this directly bonded composite crystal wafer 2. These etching masks 3 are formed in such a manner that the right-hand direction (as seen when the composite tuning fork shaped crystal elements 1 that will be formed later are stood upright) is arrayed along the −X-axis direction. The composite crystal wafer 2 is then selectively etched by wet etching, to obtain a large number of the composite tuning fork shaped crystal elements 1 (which will become angular velocity sensor elements).

An electrode for driving the tuning fork in resonance is provided on each of the tines of the tuning fork of the angular velocity sensor element, in order to detect the Coriolis force imposed thereon. In this case, a surface electrode 6a on one tine of the tuning fork (on the right-hand side in the linkage diagram of FIG. 9) and a rear-surface electrode 7b on the other tine of the tuning fork (the left-hand side in FIG. 9) are connected in common and lead out to a first drive terminal D1. Similarly, a rear-surface electrode 6b on the other tine of the tuning fork leads out to a second drive terminal D2.

Electrodes 6c and 7c on the inner side surfaces of the two tines of the tuning fork are connected together, electrodes 6d and 7d on the outer side surfaces thereof are also connected together, and these connections lead out to first and second sensor terminals S1 and S2, respectively. A surface electrode 7a on the other tine of the tuning fork leads out to a monitor terminal M as shown in FIG. 9.

A schematic configurational diagram of a prior-art example of an angular velocity sensor is shown in FIG. 10. The angular velocity sensor shown in FIG. 10 is formed of an oscillation circuit 8 connected to the first and second drive terminals D1 and D2, to excite the tuning fork into resonance; charge amplifiers 9a and 9b and a differential amplifier 10 connected to the sensor terminals S1 and S2, to amplify the electrical charge due to the Coriolis force; a synchronization detection circuit 11 that detects the amount of electrical charge due to the Coriolis force from the differential amplifier 10; a low-pass filter 12 that obtains a DC voltage that is a smoothed output from the synchronization detection circuit 11 in response to angular velocity (a detected angle of rotation); a charge amplifier 9c connected to the monitor terminal M, to amplify the electrical charge due to the resonance of the tuning fork; and an automatic gain control (AGC) circuit 13 that fixes the amplitude of the tuning fork's resonance in accordance with the magnitude of the thus amplified electrical charge. Note that the synchronization frequency for the synchronization detection circuit 11 is supplied from the monitor terminal M in this case. The electrical charge caused by the Coriolis force is detected by the thus-configured angular velocity sensor, to reliably determine the angle of rotation thereof.

However, the angular velocity sensor element of this prior-art example does not have a favorable configuration from the viewpoints of improving the crystal impedance (hereinafter abbreviated to CI) when acting as a tuning fork shaped oscillator, and the breaking strength, frequency stability, and CI stability with respect to the drive power (in other words, the drive level characteristics thereof), as well as the uniformity between elements.

The problems with the angular velocity sensor element of this prior-art example are discussed below. The angular velocity sensor element of the above-described configuration is obtained by using wet etching to etch the composite crystal wafer 2 shown in FIG. 8 and thus obtain the individual composite tuning fork shaped crystal elements 1 (see FIG. 7). Since the crystal has etching anisotropy, the etching speed is different in the different crystalline axis directions. Moreover, the etching mask is formed on the composite crystal wafer 2 in this case in such a manner that the two crystal wafers 2a and 2b in this case are connected together with the X-axis directions thereof oriented in opposite directions and the right side surface of each completed tuning fork form the −X face, when the tuning fork shaped crystal elements 1a and 1b are viewed in an upright attitude. For that reason, a distinctive configuration is formed in the handle portion of the tuning fork (the lower surface portion of the groove of the tuning fork).

An exploded perspective view of the tuning fork with the tines cut away is shown in FIG. 11A, to illustrate this distinctive configuration of the handle portion of the tuning fork. As is clear from this FIG. 11A, a mountain-shaped portion 100 is created where the connective interface forms a peak in the handle portion of the tuning fork. The inner side surfaces of the root portions of tines 101 and 102 of the tuning fork are connected to the mountain-shaped portion 100. An inclined surface 100a that is the main part of this mountain-shaped portion 100 configures a surface that is called the R face of the crystal and surfaces 100b and 100c to the left and right thereof configure r faces of the crystal. This is because the etching speed of the R face is greater than that of the r faces.

A perspective view of a cutaway through the base portion of the tuning fork and the tine 101 of the tuning fork is shown in FIG. 11B. As is clear from this perspective view, a protruberance 101a caused by etching anisotropy is created in the side surface of the tine portion of the tuning fork that abuts the +X face of the crystal. The ridge line of this protruberance 101a is on the +X face of the tuning fork shaped crystal elements 1a and 1b and is created along the longitudinal direction of the tine portion of the tuning fork in the vicinity of a boundary 105 at which the tuning fork shaped crystal elements 1a and 1b are connected. This ridge line crosses the above-described mountain-shaped portion 100 at a position that is slightly offset from the ridge line of the mountain-shaped portion 100.

The above-described physical shape of the handle portion of the tuning fork obstructs the previously mentioned electrical characteristics. For example, when the left and right tines of the turning fork resonate, stresses are generated in the vertical direction in the handle portion of the tuning fork. However, since the mountain-shaped portion 100 suppresses any change in position in the vertical direction, the resonance of the tuning fork is also suppressed. In other words, the left and right tines 101 and 102 of the tuning fork are restrained mechanically by the mountain-shaped portion 100, increasing the load on the resonance of the tuning fork. This increases the CI.

In addition, since stress concentrations can easily occur in the vicinity of an intersection P between the ridge line of the protruberance 101a and the mountain-shaped portion 100 (see FIG. 11B) when the tines of the tuning fork are resonating, this could cause problems such as cracks when the electrical power applied to the tuning fork is increased. This is a cause of deterioration in the drive level characteristics.

In particular, when the amplitude level is low in an angular velocity sensor that is designed to maintain a fixed amplitude level for the tuning fork resonance by the AGC circuit provided with the monitor terminal of the above-described configuration, there is an increase in the electrical power that automatically drives the amplitude to be constant. This can easily cause damage to the tuning fork shaped crystal oscillator. (See Japanese Patent Laid-Open Publication No. 2002-188922, hereinafter referred to as Reference Document 1).

SUMMARY OF THE INVENTION

An objective of the present invention is to provide a tuning fork shaped oscillator, an angular velocity sensor element, and an angular velocity sensor with improved electrical capabilities such as breaking strength with respect to CI and drive power, CI stability, and frequency stability, together with a method of fabricating the same.

The present invention draws attention to a configuration in which the tuning-fork groove disclosed in Japanese Patent Laid-Open Publication No. 2002-188922 is V-shaped. In other words, it concentrates on a configuration in which the left side of the direction that is orthogonal to the direction in which tine portions of the tuning fork extend from a tuning-fork base portion is taken to be the −X-axis direction of the tuning fork shaped crystal element on the front surface thereof. In other words, this is a configuration in which each of the two tuning fork shaped crystal elements is oriented before the direct bonding in such a manner that the +X face of the crystal that is orthogonal to the +X-axis direction is the right side surface of the tuning fork shaped crystal element when viewed in a standing state.

The present inventors have also discovered that tuning fork shaped crystal elements of such a configuration ensure that the handle portion of the tuning fork is not the asymmetrical V-shape that is seen when the crystal is a single plate, but is s symmetrical V-shape.

The present invention relates to a configuration in which two tuning fork shaped crystal elements that have been formed by wet etching during the process of forming the external shape of a tuning fork, in such a manner that the longitudinal direction of the tuning fork is aligned on the Y-axis of the crystalline axes (XYZ) and also the lateral direction thereof is aligned on the X-axis, are bonded together with the ±X-axis directions thereof oriented in opposite directions; and the right side surface of each of the two tuning fork shaped crystal elements is the +X face of the crystal when the two tuning fork shaped crystal elements are viewed in an upright attitude.

In the tuning fork shaped crystal oscillator of the present invention, two tine portions of the tuning fork extend out from a tuning-fork base portion, the handle portion of the tuning fork has a laterally symmetrical V-shaped groove, and the inclined portions of the V-shaped groove have a ridge line along the center thereof and a sectional surface that forms a triangle.

Alternatively, the tuning fork shaped crystal oscillator of the present invention, two tine portions of the tuning fork extend out from a tuning-fork base portion, the handle portion of the tuning fork has a laterally symmetrical U-shaped groove, and the inclined portions of the U-shaped groove have a ridge line along the center thereof and a sectional surface that forms a triangle.

With the present invention, left and right surfaces of the ridge line of the inclined portions are R faces of the crystal.

A tuning fork shaped crystal oscillator in accordance with the present invention configures an angular velocity sensor element that is provided with a drive electrode for exciting the tuning fork into resonance and a sensor electrode for detecting electrical charge due to the Coriolis force.

The present invention configures an angular velocity sensor that is provided with an angular velocity sensor element; an oscillation circuit for exciting the tuning fork of the angular velocity sensor element into resonance; and a synchronization detection circuit for detecting electrical charge from a sensor electrode of the tuning fork shaped crystal oscillator.

A method of fabricating a tuning fork shaped crystal oscillator in accordance with the present invention comprises the steps of: forming a composite crystal wafer by direct bonding of two Z-cut crystal wafers with the X-axes thereof oriented in opposite directions; forming an etching mask for the formation of a large number of composite tuning fork shaped crystal elements on the front and rear surfaces of the composite crystal wafer, with the lateral direction of the composite tuning fork shaped crystal element oriented along the X-axis and the longitudinal direction thereof oriented along the Y-axis; and selectively etching the composite crystal wafer on which the etching mask is formed by wet etching, to form the composite tuning fork shaped crystal elements; wherein the tuning fork shaped crystal elements on the front and rear surfaces of the composite tuning fork shaped crystal element are formed during the formation of the etching mask on the front and rear surfaces of the composite crystal wafer, in such a manner that the right side direction of each of the tuning fork shaped crystal element when viewed from the front surface in an upright attitude is aligned on the +X direction of the crystal.

The present invention ensures that, when the two tuning fork shaped crystal elements are viewed in an upright attitude before the direct bonding, each of the two tuning fork shaped crystal elements is oriented in such a manner that the +X face of the crystal that is orthogonal to the +X-axis direction forms the right side surface of that tuning fork shaped crystal element, and thus the outer shape formed by the wet etching is either V-shaped or U-shaped depending on the amount of processing during the etching, as shown by way of example in Reference Document 1.

The results of observations made by the present inventors show that the handle portion of the tuning fork is not asymmetrical but has a laterally symmetrical V-shape or U-shape. The handle portion of the tuning fork is therefore of a shape that approximates that of a tuning fork. This ensures that the load thereon due to the resonance of the tuning fork is reduced, thus reducing the CI. Concomitant therewith, the results of experiments performed by the present inventors make it clear that the CI and drive power are reduced and the electrical capabilities such as breaking strength, frequency stability, and CI stability are improved.

In accordance with the present invention, the handle portion of the tuning fork is assumed to be V-shaped or U-shaped. The CI is therefore reduced, thus improving the electrical characteristics thereof reliably. It is further clear that the present invention provides a specific configuration in which both surfaces of the triangle formed by the cross-sectional surface of the V-shaped groove or U-shaped groove are R faces of the crystal.

Since the tuning fork shaped crystal oscillator of the present invention forms an angular velocity sensor element that is provided with a drive electrode for exciting the tuning fork into resonance and a sensor electrode for detecting electrical charge due to the Coriolis force, an angular velocity sensor element with excellent electrical capabilities can be obtained thereby.

Since an angular velocity sensor in accordance with the present invention can be configured of this angular velocity sensor element, an oscillation circuit for driving the tuning fork of the angular velocity sensor element in resonance, and a synchronization detection circuit for detecting electrical charge from a sensor electrode of the tuning fork shaped crystal oscillator, a high-performance angular velocity sensor can be obtained thereby.

Since the fabrication method in accordance with the present invention ensures that the etching mask is formed on the front and rear surfaces of the composite crystal wafer in such a manner that the right-hand direction of each tuning fork shaped crystal element on the front and rear of each composite tuning fork shaped crystal element is oriented in the −X direction of the crystal, when viewed from the front surface in an upright attitude, thus making it possible to obtain a V-shaped or U-shaped tuning fork shaped oscillator after the wet etching wherein the handle portion of the tuning fork has a symmetrical configuration.

DETAILED DESCRIPTION OF PREFERRED EMBODIMENTS

Figure 1:
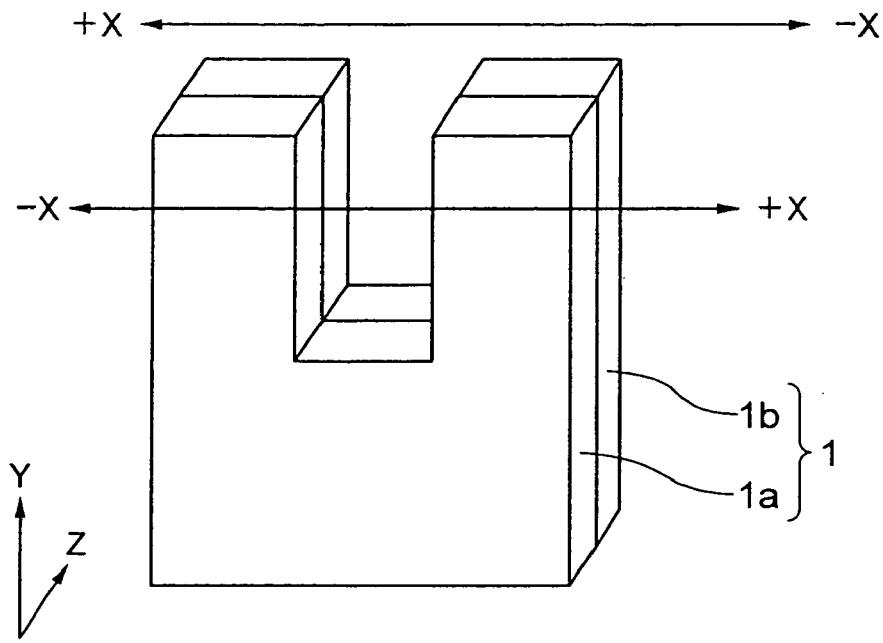
FIG. 1 is a perspective view of an embodying example of an angular velocity sensor element in accordance with the present invention.
Figure 2:
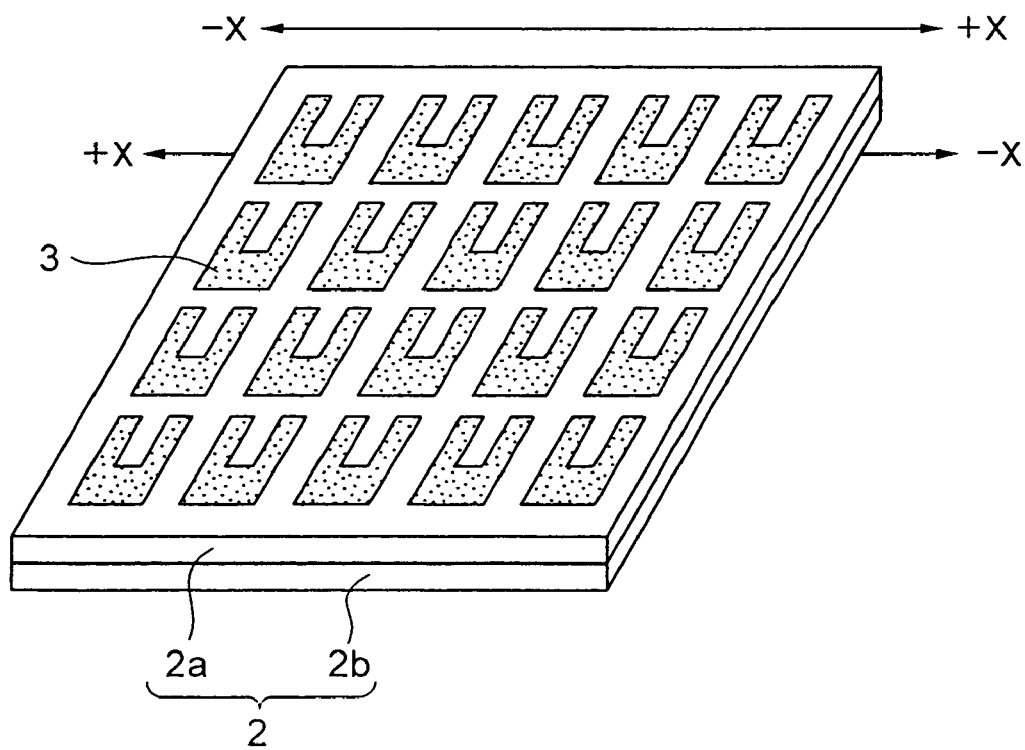
FIG. 2 is a perspective view of an embodying example of a composite crystal wafer in accordance with the present invention.

An embodying example of the present invention is shown in FIGS. 1 and 2, with FIG. 1 being a perspective view of an angular velocity sensor element in accordance with the present invention and FIG. 2 being a perspective view of a composite crystal wafer.

In the construction of the angular velocity sensor element of the present invention, two Z-cut crystal wafers 2*a* and 2*b* are first bonded together directly (not necessarily by using an adhesive; they could also be bonded by turning the bond surfaces into mirror surfaces), with the ±X-axis directions thereof oriented in opposite directions, to form a composite crystal wafer 2 as shown in FIG. 2. An etching mask is then formed by a photographic printing technique on each of the front and rear surfaces of the composite crystal wafer 2, for the formation of a large number of composite tuning fork shaped crystal elements 1.

During this process, the etching masks 3 are formed in such a manner that the lateral dimension of each of the composite tuning fork shaped crystal elements 1 that will be formed as shown in FIG. 1 is arrayed along the X-axis and the longitudinal direction thereof is arrayed in the Y-axis. In addition, when tuning fork shaped crystal elements 1*a* and 1*b* at the front and rear of the composite tuning fork shaped crystal element 1 are viewed in an upright attitude, the configuration is such that the right-hand direction of each is arrayed in the X-axis direction (the right side surface thereof is the +X face).

The composite crystal wafer 2 is then selectively etched by wet etching, to obtain a large number of the composite tuning fork shaped crystal elements 1. It should be noted, however, that neighboring composite tuning fork shaped crystal elements 1 are still linked in an integral form at this point. After drive electrodes, sensor electrodes, and monitor electrodes (not shown in the figures) have been formed thereon by similar wet etching, individual angular velocity sensor elements are obtained (see FIG. 1). Terminals retained by the base portion of the tuning fork of each of these angular velocity sensor elements are drawn out and enclosed in a sealed vessel (not shown in the figures).

In this angular velocity sensor element, the right-hand direction of each individually separated composite tuning fork shaped crystal element 1 is aligned in the +X-axis direction of the crystal, when the tuning fork shaped crystal elements 1a and 1b on the front and rear of the composite tuning fork shaped crystal element 1 are viewed in an upright attitude, in other words, the +X face of the crystal forms the right side surface thereof. That is to say, two tuning fork shaped crystal elements 1a and 1b of the composite tuning fork shaped crystal element 1 are bonded together with the ±X-axis directions thereof oriented in opposite directions, with the +X face of each forming the right side surface thereof when the tuning fork shaped crystal elements 1a and 1b are viewed in an upright attitude.

Figure 3A:
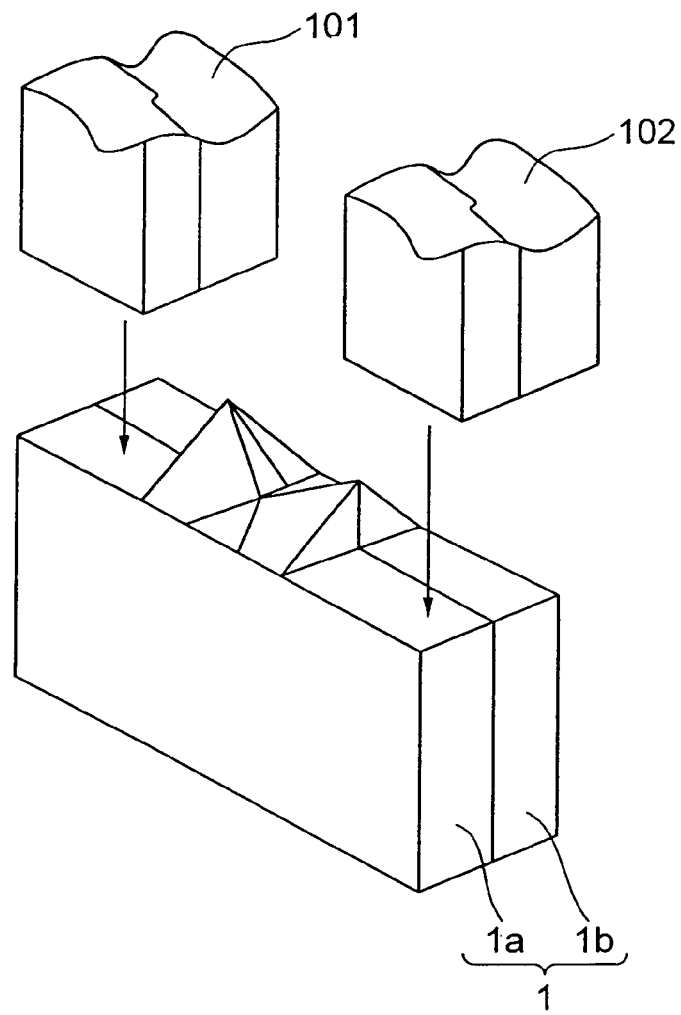
FIG. 3 is illustrative of an embodying example of the angular velocity sensor element of the present invention, with FIG. 3A being an exploded perspective view with the tines of the tuning fork cut away to show the inclined portions of the V-shaped groove
FIG. 3B is a front view thereof.
FIG. 3C is another embodying example of the angular velocity sensor element of the present invention with the tines of the tuning fork cut away to show the inclined portions of the U-shaped groove and FIG. 3D is a front view thereof.
Figure 3B:
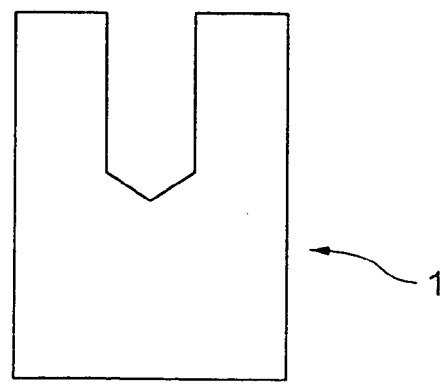
Figure 3C:
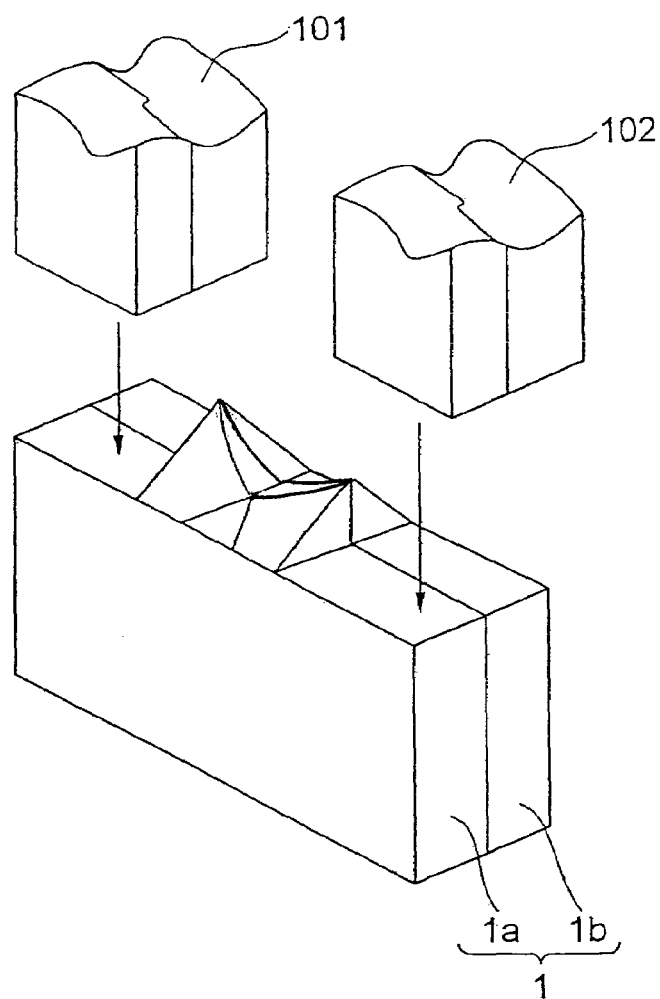
Figure 3D:
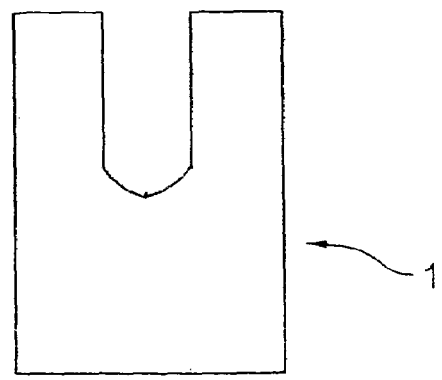
Figure 11A:
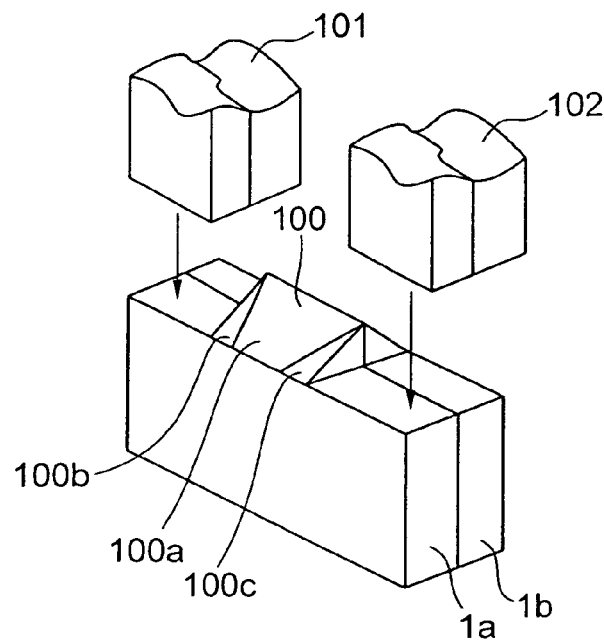
FIG. 11 is illustrative of the prior-art example of the angular velocity sensor element, with FIG. 11A being an exploded perspective view with the tines of the tuning fork cut away and FIG. 11B being a perspective view of one tine of the tuning fork.
Figure 11B:
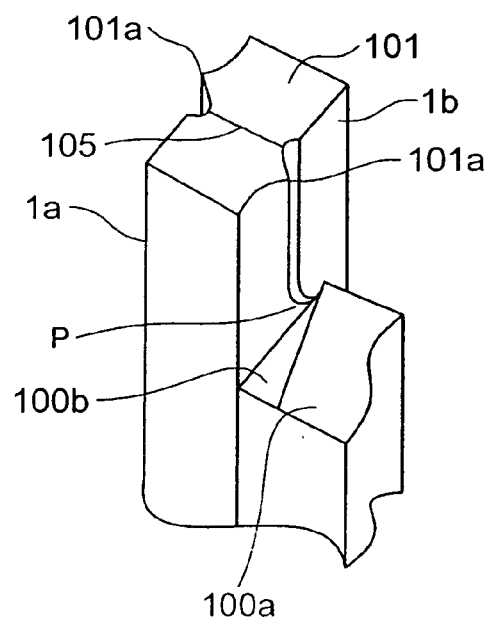

The exploded perspective view shown in FIG. 3A is of the composite tuning fork shaped crystal element 1 with the tines of the tuning fork cut away to illustrate the handle portion of the tuning fork in particular, and a front view thereof is shown in FIG. 3B. As is clear from FIGS. 3A and 3B, the handle portion of the tuning fork is formed into a laterally symmetrical V shape (a V-shaped groove), as seen from the front thereof. The left and right inclined portions of this V-shaped groove are inclined portions having a ridge line in the center thereof and a sectional surface that forms a triangle. Each surface of each of these inclined portions is an R face of the crystal. Moreover, the intersection P that causes problems in the prior art (see the previously mentioned FIG. 11B) is not formed in the configuration of the present invention.

Figure 4:
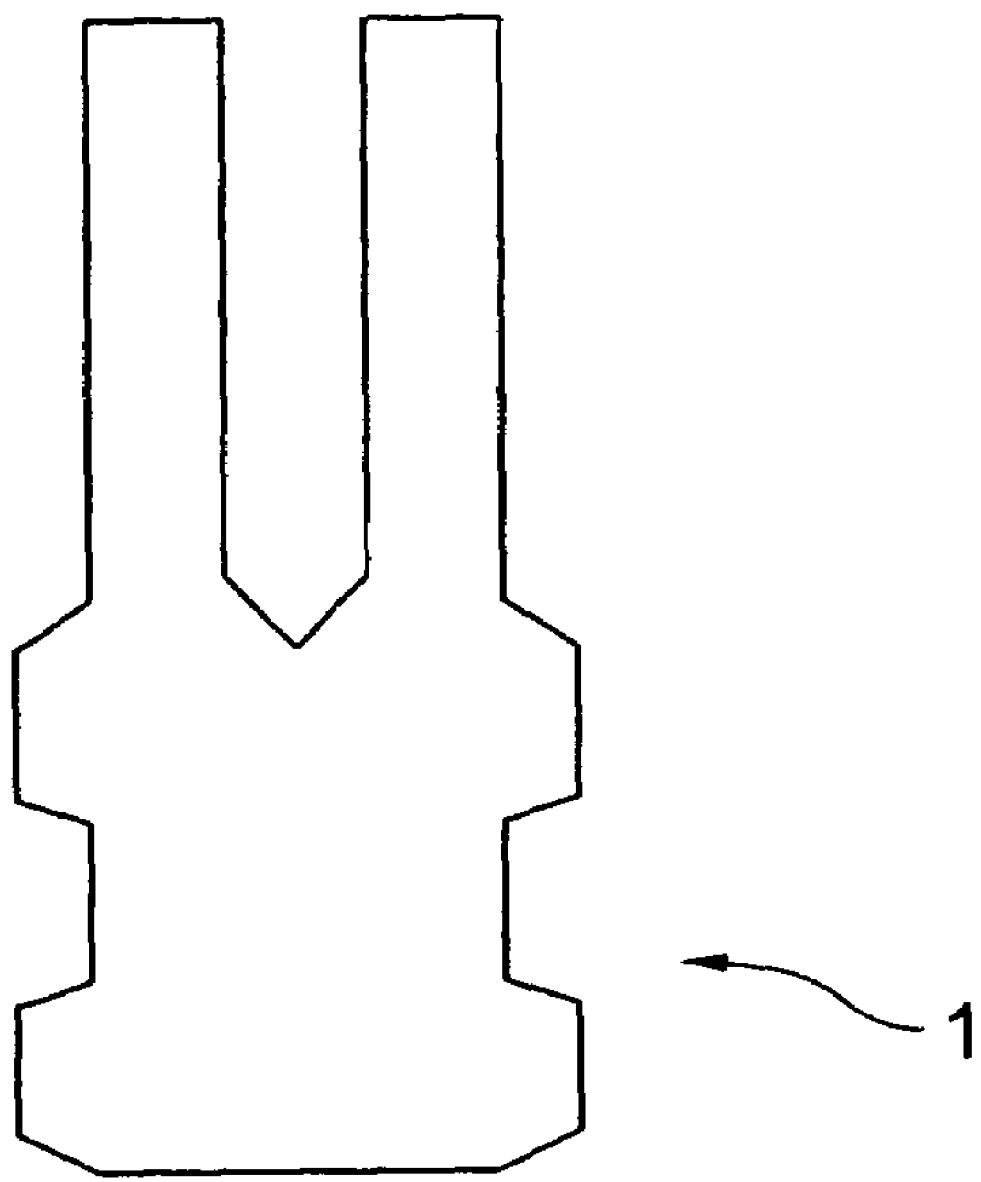
FIG. 4 is a front view of an angular velocity sensor element used in experiments on an embodying example of the present invention.

The present invention is described further below, with reference to the results of experiments performed by the present inventors. In this case, the composite tuning fork shaped crystal element 1 has a shape that is a combination of two tine portions of a tuning fork on a tuning-fork base portion of a width that is wide enough for the two tine portions of the tuning fork with a space therebetween, as shown in FIG. 4. Each composite tuning fork shaped crystal element 1 is formed to the same dimensions. In addition, the previously-described drive and sensor electrodes are formed thereon, then experiments were performed to compare the electrical characteristics of the product in accordance with the present invention and a prior-art product (having the handle portion of the tuning fork as described with reference to FIG. 11) when the tuning fork thereof was driven to resonate.

Figure 5A:
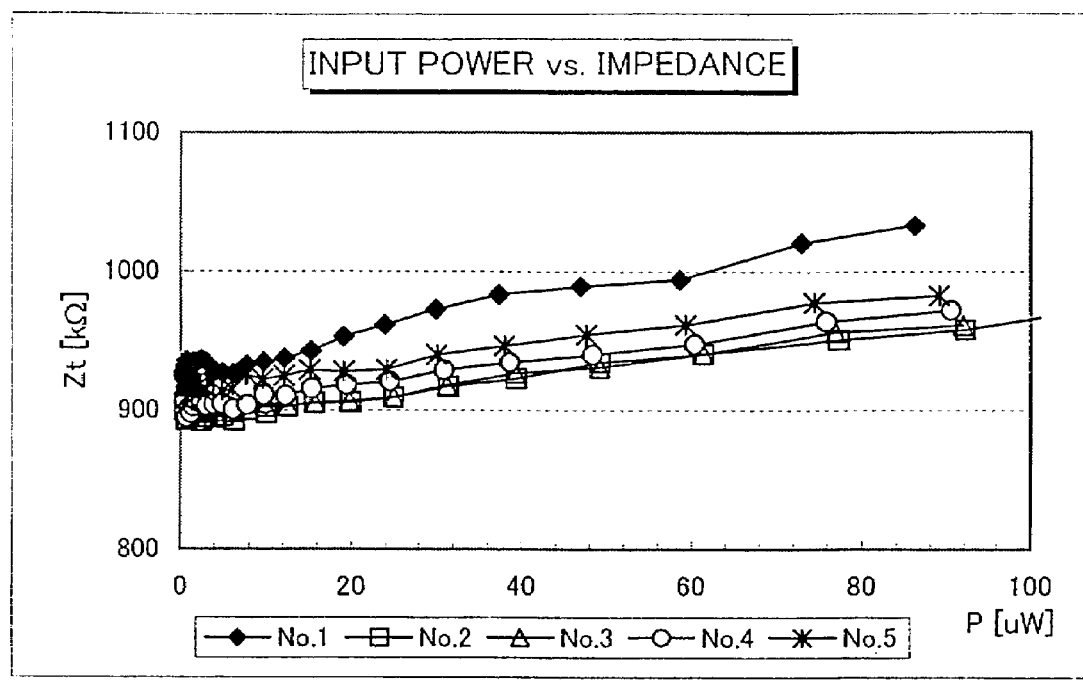
FIG. 5 shows the characteristics of drive power vs. CI, to illustrate the operational effect of the present invention, with FIG. 5A showing the characteristic of drive power vs. impedance for products in accordance with the present invention and FIG. 5B showing the characteristic of drive power vs. impedance for prior-art products.
Figure 5B:
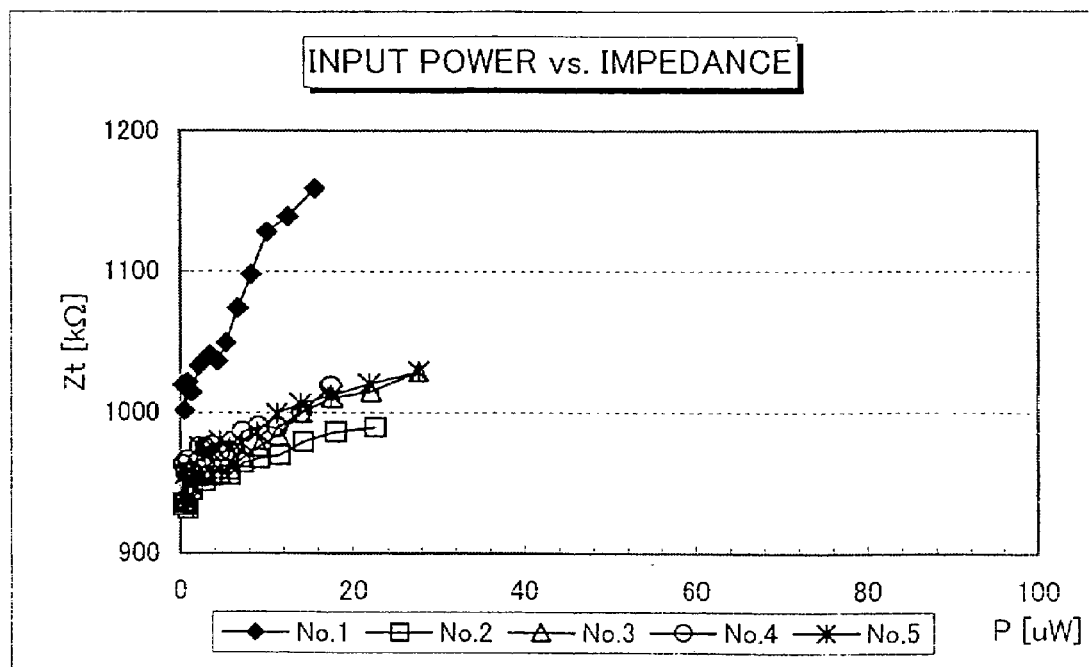
Figure 6A:
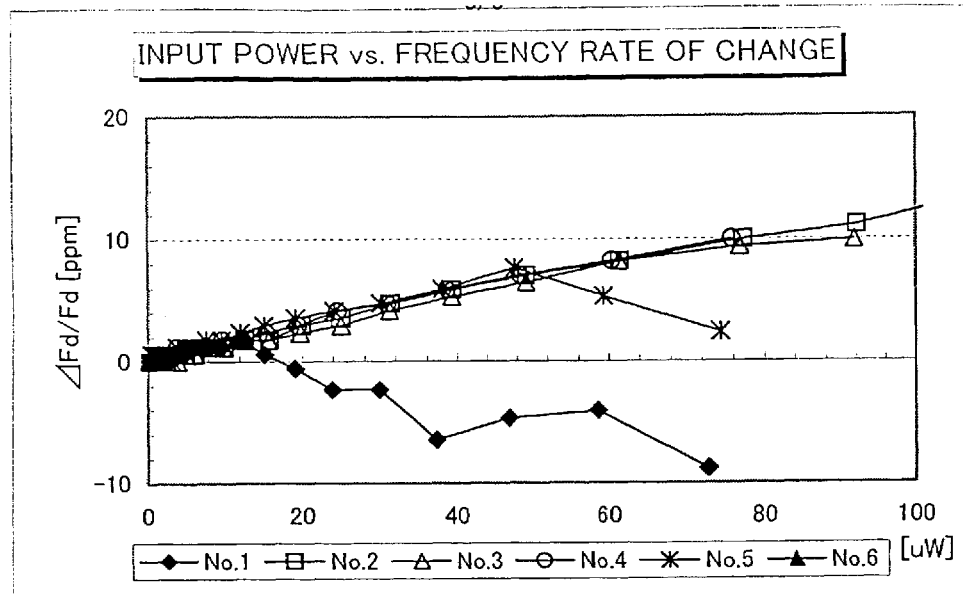
FIG. 6 shows the characteristics of drive power vs. frequency change ratio, to illustrate the operational effect of the present invention, with FIG. 6A showing that of the products in accordance with the present invention and FIG. 6B showing that of the prior-art products.
Figure 6B:
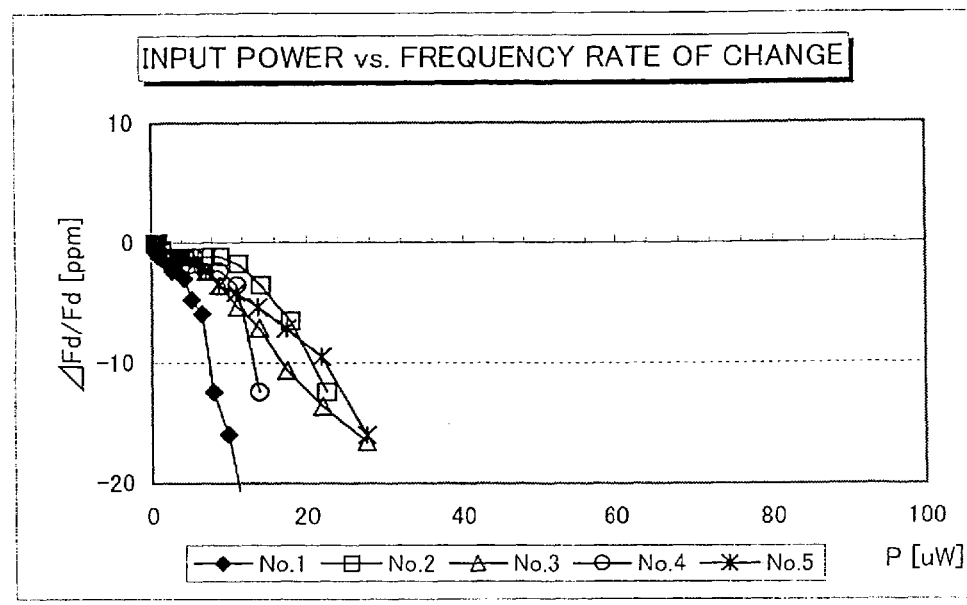
Figure 7:
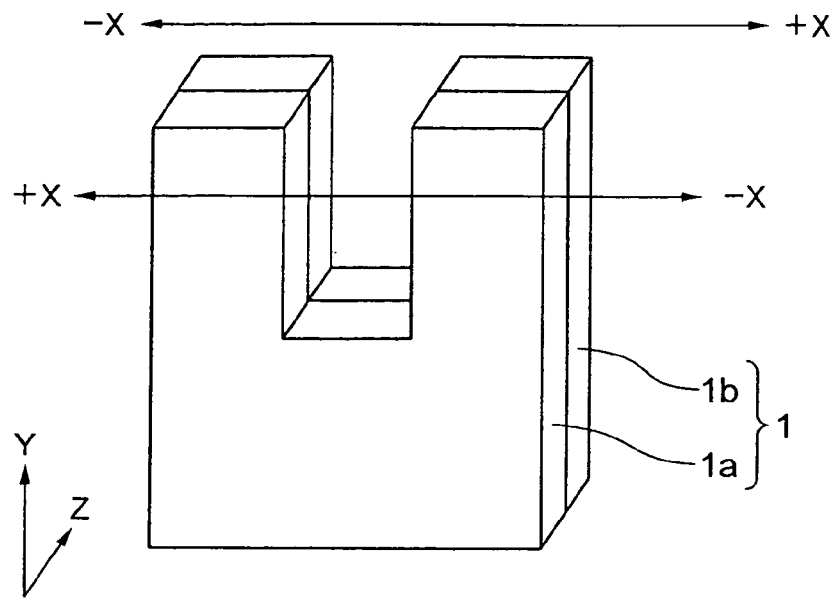
FIG. 7 is illustrative of a prior-art example of an angular velocity sensor element.
Figure 8:
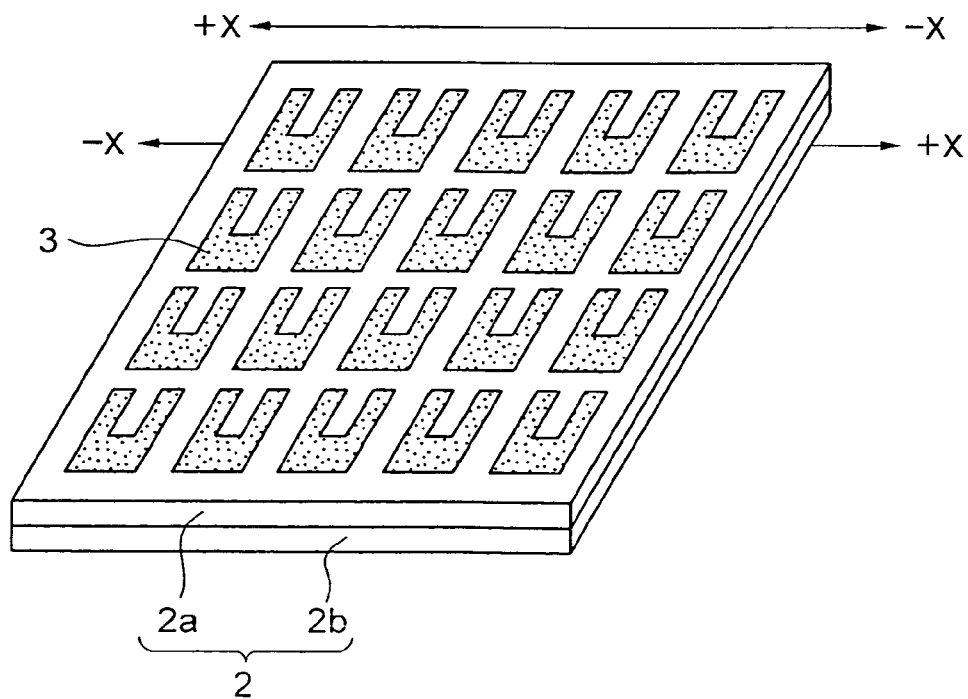
FIG. 8 is illustrative of a prior-art example of a method of fabricating a composite crystal wafer.
Figure 9:
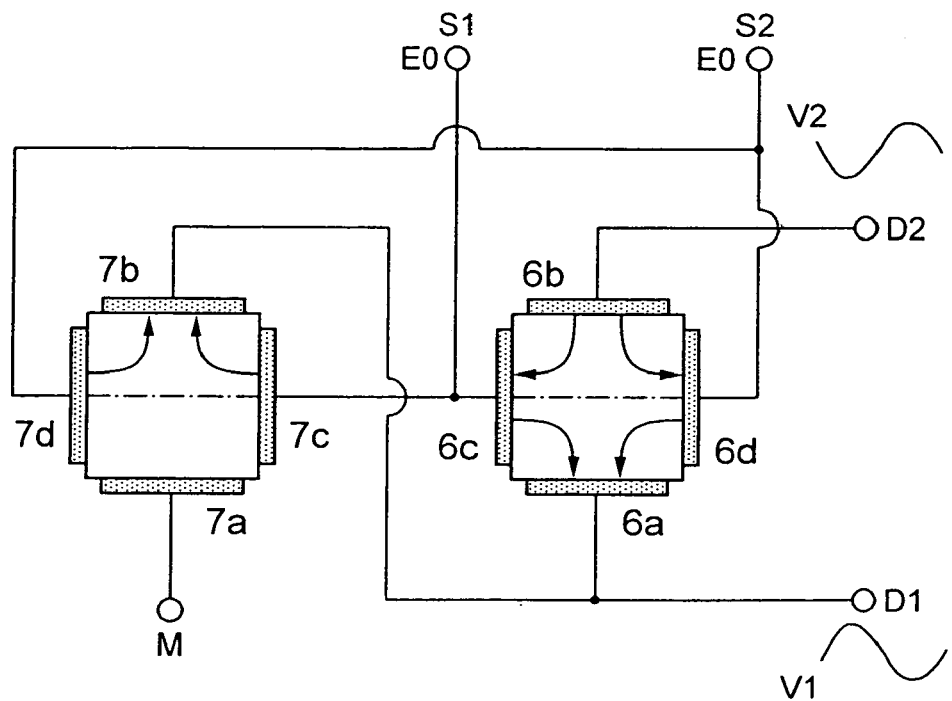
FIG. 9 is a linkage diagram of the prior-art example of the angular velocity sensor element.
Figure 10:
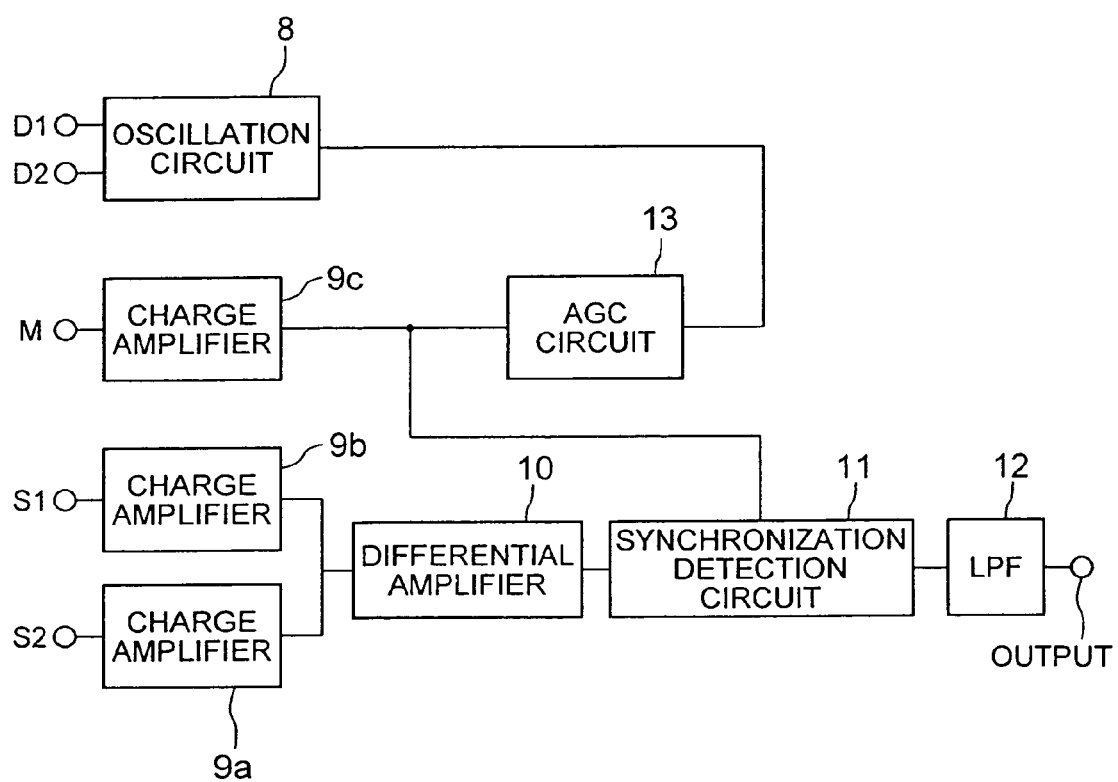
FIG. 10 is a schematic block diagram of the prior-art example of the angular velocity sensor.

Characteristics of impedance with respect to drive power are shown in FIGS. 5A and 5B and characteristics of frequency change ratio with respect to drive power are shown in FIGS. 6A and 6B, where FIGS. 5A and 6A concern the product in accordance with the present invention and FIGS. 5B and 6B concern a prior-art product. Note that there were five test products in each set of experiments and the resonance frequency was 17 kHz.

First of all, a comparison is done of the breaking strength with respect to drive power of the product in accordance with the present invention and the prior-art product, with reference to FIGS. 5A and 5B. In this case, the drive power that limited the breaking strength of the product in accordance with the present invention is 72.9, 104.3, 91.8, 75.9, and 74.4 µW, giving an average of 83.9 µW, and that of the prior-art product is 12.6, 22.6, 27.6, 14.1, and 27.6 µW, giving an average of 20.9 µW. The breaking strength of the product in accordance with the present invention is therefore improved to approximately four times that of the prior-art product. Note that the limit on the breaking strength in this case is a drive power that cannot be measured; it means the limit at which the angular velocity sensor element becomes damaged or the resonance of the tuning fork loses phase and thus the tuning fork is in a non-resonating state.

In both sets of samples, the CI increased with increasing drive power. In contrast to the product in accordance with the present invention in which the change was gradual up until the limit of the breaking strength, in the prior-art product this change was sudden. It is therefore clear that the stability of the CI with respect to the drive power is exceptionally better in the product in accordance with the present invention than in the prior-art product.

The frequency change ratio with respect to drive power also changed with increasing drive power in both cases, as shown in FIGS. 6A and 6B. In a similar manner to the CI, in contrast to this embodying example of the present invention in which the change was gradual up until the limit of the breaking strength, in the prior-art product this change was sudden. The drive power that ensures a frequency change ratio $\Delta f/f0$ of within 6 ppm in this embodying example of the present invention, for example, is approximately 29.9, 39.4, 39.3, 38.7, and 38.0 µW, giving an average of 37.01 µW. For the prior-art product, it is 6.7, 14.3, 11.4, 11.4, and 14.0 µW, giving an average of 11.6 µW. The product in accordance with the present invention therefore has an electrical power endurance that is at least three times that of the prior-art product.

Finally, CI is compared, with reference to FIGS. 5A and 5B. The CI of the product in accordance with the present invention in the vicinity of 3 µW is 934, 895, 900, 903, and 915 kΩ, giving an average of 909 kΩ, and the CI of the prior-art product is 1037, 950, 956, 975, and 969 kΩ, giving an average of 977 kΩ. It can therefore be appreciated that the product in accordance with the present invention has a CI that is improved by approximately 7% in comparison with the prior-art product.

It is also clear from the results of experiments relating to the present invention that the product in accordance with the present invention has considerably improved electrical capabilities such as breaking strength, CI stability, and frequency stability with respect to drive power, in comparison with the prior-art product. These results are obtained by bonding the tuning fork shaped crystal elements 1a and 1b together with the right side surfaces thereof forming +X faces and the ±X-axis directions thereof oriented in opposite directions. In other words, when wet etching is performed in those axial directions, the handle portion of the tuning fork develops a laterally symmetrical V-shape. The handle portion of the tuning fork therefore approaches the ideal shape for a tuning fork, so that load thereon is reduced and the resonance of the tuning fork is smooth. These are factors that lead to the improvements in the electrical characteristics relating to CI and drive power. When the previously-described angular velocity sensor is configured, the quality thereof is superior.

In the above-described embodying example of the present invention, the handle portion of the tuning fork was V-shaped but it could equally well be U-shaped. The effects of the present invention can be achieved by slightly changing factors such as the shape of the etching mask and the etching time, provided the resultant shape is symmetrically V-shaped or U-shaped. In addition, lateral symmetry does not mean symmetry from a strictly geometrical viewpoint, but effective symmetry. In other words, it is the symmetry obtained by orienting the ±X-axis directions of the tuning fork shaped crystal elements so as to face in opposite directions, with the right side surface thereof being the +X face when each tuning fork shaped crystal element is viewed in an upright attitude, then directly bonding together the tuning fork shaped crystal elements. In addition, although the description above related to an angular velocity sensor element, the present invention can also be applied to cases in which it is used as an ordinary tuning fork shaped oscillator.

The shape of each composite tuning fork shaped crystal element has been defined by experiments performed by the present inventors, where the tine portions of the tuning fork are connected to a tuning-fork base portion that is wide enough for the two tine portions of the tuning fork and also a space therebetween. Since the thus-configured shape ensures that the resultant tuning fork has inclined portions to the left and right of the two tine portions of the tuning fork (inclined portions having a ridge line therebetween and configured of R faces of the crystal on either side of that ridge line), the resistance to electrical power thereof is further improved. However, it should be noted that the present invention would of course be effective for a tuning fork of a simple tuning-fork shape as seen in plan view in FIG. 1. The effects of the present invention can also be achieved, even with the handle portion of a tuning fork that has such a simple tuning-fork shape.

What is claimed is:

1. A tuning fork shaped crystal oscillator, wherein two tuning fork shaped crystal elements formed by wet etching during formation of the external shape of a tuning fork, in such a manner that the longitudinal direction of the tuning fork is aligned on the Y-axis of the crystalline axes (XYZ) and the lateral direction thereof is aligned on the X-axis, are bonded together with the ±X-axis directions thereof oriented in opposite directions, the right side surface of each of said two tuning fork shaped crystal elements being the +X face of the crystal when said two tuning fork shaped crystal elements are viewed in an upright orientation from each Z-axis direction, wherein two tine portions of the tuning fork extend out from a tuning-fork base portion, a handle portion of the tuning fork has a laterally symmetrical V-shaped groove having inclined portions, and said inclined portions of said V-shaped groove each have a ridge line along the center thereof and a sectional surface that forms a triangle.

2. A tuning fork shaped crystal oscillator, wherein two tuning fork shaped crystal elements formed by wet etching during formation of the external shape of a tuning fork, in such a manner that the longitudinal direction of the tuning fork is aligned on the Y-axis of the crystalline axes (XYZ) and the lateral direction thereof is aligned on the X-axis, are bonded together with the ±X-axis directions thereof oriented in opposite directions, the right side surface of each of said two tuning fork shaped crystal elements being the +X face of the crystal when said two tuning fork shaped crystal elements are viewed in an upright orientation from each Z-axis direction, wherein two tine portions of the tuning fork extend out from a tuning-fork base portion, a handle portion of the tuning fork has a laterally symmetrical U-shaped groove having inclined portions, and said inclined portions of said U-shaped groove each have a ridge line along the center thereof and a sectional surface that forms a triangle.

3. The tuning fork shaped crystal oscillator as defined by claim 1, wherein: surfaces to the left and right of said ridge line of each of said inclined portions are R faces of the crystal.

4. The tuning fork shaped crystal oscillator as defined by claim 2, wherein: surfaces to the left and right of said ridge line of each of said inclined portions are R faces of the crystal.

5. The tuning fork shaped crystal oscillator as defined by claim 1, wherein: said tuning fork shaped crystal oscillator is provided with a drive electrode for exciting the tuning fork into resonance and a sensor electrode for detecting electrical charge due to the Coriolis force and functions as an angular velocity sensor element.

6. The tuning fork shaped crystal oscillator as defined by claim 1, wherein: said tuning fork shaped crystal oscillator is provided with a drive electrode for exciting the tuning fork into resonance and a sensor electrode for detecting electrical charge due to the Coriolis force and functions as an angular velocity sensor element.

7. The tuning fork shaped crystal oscillator as defined by claim 2, wherein: said tuning fork shaped crystal oscillator is provided with a drive electrode for exciting the tuning fork into resonance and a sensor electrode for detecting electrical charge due to the Coriolis force and functions as an angular velocity sensor element.

8. The tuning fork shaped crystal oscillator as defined by claim 3, wherein: said tuning fork shaped crystal oscillator is provided with a drive electrode for exciting the tuning fork into resonance and a sensor electrode for detecting electrical charge due to the Coriolis force and functions as an angular velocity sensor element.

9. The tuning fork shaped crystal oscillator as defined by, claim 5, further comprising: an oscillation circuit for exciting the tuning fork of said angular velocity sensor element into resonance, and a synchronization detection circuit for detecting electrical charge from a sensor electrode of said tuning fork shaped crystal oscillator.

10. A method of fabricating a tuning fork shaped crystal oscillator, said method comprising the steps of:
forming a composite crystal wafer by direct bonding of two Z-cut crystal wafers with the X-axes thereof oriented in opposite directions;
forming an etching mask for the formation of a large number of composite tuning fork shaped crystal elements on the front and rear surfaces of said composite crystal wafer, with the lateral direction of said composite tuning fork shaped crystal element to be oriented along said X-axis and the longitudinal direction thereof to be oriented along the Y-axis;
selectively etching said composite crystal wafer on which said etching mask is formed by wet etching, to form said composite tuning fork shaped crystal elements; and
forming said tuning fork shaped crystal elements on the front and rear surfaces of said composite tuning fork shaped crystal element, during the formation of said etching mask on the front and rear surfaces of said composite crystal wafer, in such a manner that the right side direction of each of said tuning fork shaped crystal element when viewed from the front surface in an upright attitude is aligned on the +X direction of the crystal.

11. The tuning fork shaped crystal oscillator as defined by claim 6, comprising:

said angular velocity sensor element, an oscillation circuit for exciting the tuning fork of said angular velocity sensor element into resonance, and a synchronization detection circuit for detecting electrical charge from a sensor electrode of said tuning fork shaped crystal oscillator.

12. The tuning fork shaped crystal oscillator as defined by claim 7, comprising:

said angular velocity sensor element, an oscillation circuit for exciting the tuning fork of said angular velocity sensor element into resonance, and a synchronization detection circuit for detecting electrical charge from a sensor electrode of said tuning fork shaped crystal oscillator.

13. The tuning fork shaped crystal oscillator as defined by claim 8, comprising:

said angular velocity sensor element, an oscillation circuit for exciting the tuning fork of said angular velocity sensor element into resonance, and a synchronization detection circuit for detecting electrical charge from a sensor electrode of said tuning fork shaped crystal oscillator.

14. The tuning fork shaped crystal oscillator as defined by claim 2, wherein said tuning fork shaped crystal oscillator is provided with a drive electrode for exciting the tuning fork into resonance and a sensor electrode for detecting electrical charge due to the Coriolis force and functions as an angular velocity sensor element.

15. The tuning fork shaped crystal oscillator as defined by, claim 14, further comprising:

an oscillation circuit for exciting the tuning fork of said angular velocity sensor element into resonance, and a synchronization detection circuit for detecting electrical charge from a sensor electrode of said tuning fork shaped crystal oscillator.

* * * * *